United States Patent
Suga et al.

[11] Patent Number: 5,130,260
[45] Date of Patent: Jul. 14, 1992

[54] METHOD OF GETTERING UNINTENTIONAL MOBILE IMPURITIES IN SILICON WAFER BY USING A DAMAGED LAYER EXPOSED TO THE REVERSE SURFACE THEREOF

[75] Inventors: Hisaaki Suga, Saitama; Yoshinobu Nakada, Tokyo; Kazuhiro Akiyama, Saitama; Shunji Ishibashi, Tokyo, all of Japan

[73] Assignees: Mitsubishi Materials Corporation; Nippon Silicon Kabushiki Kaisha, both of Tokyo, Japan

[21] Appl. No.: 730,264

[22] Filed: Jul. 12, 1991

[30] Foreign Application Priority Data

Jul. 13, 1990 [JP] Japan .................. 2-186039

[51] Int. Cl.⁵ .................. H01L 21/306
[52] U.S. Cl. .................. 437/11; 437/10; 437/12; 437/975; 148/DIG. 60; 148/DIG. 61
[58] Field of Search .................. 437/10, 11, 12, 975; 148/DIG. 60, DIG. 61

[56] References Cited

U.S. PATENT DOCUMENTS

| | | | |
|---|---|---|---|
| 4,415,373 | 11/1983 | Pressley | 437/11 |
| 4,539,050 | 9/1985 | Kramler et al. | 437/11 |
| 4,561,171 | 12/1985 | Schlosser | 437/12 |
| 4,608,096 | 8/1986 | Hill | 148/DIG. 60 |
| 4,645,546 | 2/1987 | Matsushita | 148/DIG. 60 |
| 4,661,166 | 4/1987 | Hirao | 437/12 |
| 4,782,029 | 11/1988 | Takemura et al. | 437/11 |

FOREIGN PATENT DOCUMENTS

| | | | |
|---|---|---|---|
| 54-6767 | 1/1979 | Japan | 437/11 |
| 58-153337 | 9/1983 | Japan | 437/11 |
| 58-180028 | 10/1983 | Japan | 437/11 |

*Primary Examiner*—Brian E. Hearn
*Assistant Examiner*—Kevin M. Picardat
*Attorney, Agent, or Firm*—Helfgott & Karas

[57] ABSTRACT

A method of gettering unintentional mobile impurities starts with production of an damaged portion on the reverse side of a silicon wafer, and the silicon wafer is placed in a high temperature vacuum ambience so that the unintentional mobile impurities are firstly trapped by the damaged portion and, then, evacuated to the high temperature vacuum ambience.

7 Claims, 2 Drawing Sheets

METHOD OF GETTERING UNINTENTIONAL MOBILE IMPURITIES IN SILICON WAFER BY USING A DAMAGED LAYER EXPOSED TO THE REVERSE SURFACE THEREOF

FIELD OF THE INVENTION

This invention relates to an extrinsic gettering technology applied to a silicon wafer and, more particularly, to a method of gettering and evacuating unintentional mobile impurities contained in a silicon wafer.

DESCRIPTION OF THE RELATED ART

In general, mobile impurities such as, for example, heavy metals are unintentionally dissolved into a silicon rod during the crystal growth, and the unintentional mobile impurities have undesirable influences on device characteristics fabricated on a silicon wafer cut from the rod. For this reason, various gettering techniques have been proposed so as to getter the unintentional mobile impurities.

A typical example of the gettering technique is disclosed in Japanese Patent Application laid-open (Kokai) No. 2-22822. According to the Japanese Patent Application laid-open, the reverse surface portion of a silicon wafer is damaged through lapping, and the damaged reverse surface portion allows the unintentional mobile impurities to be segregated therein in high temperature atmospheric pressure ambience. Thus, the damaged reverse surface portion getters the unintentional mobile impurities, and, accordingly, enhances clearness of the major surface portion of the silicon wafer. Since a silicon wafer is repeatedly subjected to high temperature heat treatment in a process sequence for fabricating an integrated circuit, the wafer supplier only produces the damaged reverse surface before delivery. The Japanese Patent Application laid-open further teaches that an etching process, an ion-implantation, a deposition of silicon nitride film or phosphosilicate glass film and a laser-beam radiation are available for formation of the damaged reverse surface portion.

However, a problem is encountered in the prior art gettering technique in that the damaged reverse surface portion is liable to be saturated with the unintentional mobile impurities, and the prior art technique is not so effective in the presence of a large amount of unintentional mobile impurities introduced in a silicon wafer during the crystal growth.

Another problem encountered in the prior art gettering technique is that the segregation slows down by getting close to the saturation, and, accordingly, the gettering is hardly completed in an initial stage of the fabrication process. This results in that the undesirable influences are still left in the major surface of the silicon wafer in the initial stage of the fabrication process.

SUMMARY OF THE INVENTION

It is therefore an important object of the present invention to provide a method of gettering unintentional mobile impurities which is free from saturation of unintentional mobile impurities.

To accomplish the object, the present invention proposes to evacuate the segregated mobile impurities from the damaged reverse surface in a high temperature vacuum ambience.

In accordance with the present invention, there is provided a method of gettering unintentional mobile impurities, comprising the steps of: a) preparing a silicon wafer unintentionally doped with the mobile impurities and having a major surface; b) producing a damaged surface portion on a reverse side of the silicon wafer, the damaged surface portion having crystal defects exposed to the reverse side; and c) placing the silicon wafer in a high temperature vacuum ambience so as to evacuate the mobile impurities from the reverse side to the high temperature vacuum ambience.

BRIEF DESCRIPTION OF THE DRAWINGS

The features and advantages of the method of gettering unintentional mobile impurities according to the present invention will be more clearly understood from the following description taken in conjunction with the accompanying drawings in which.

DESCRIPTION OF THE PREFERRED EMBODIMENT

Figure 1:
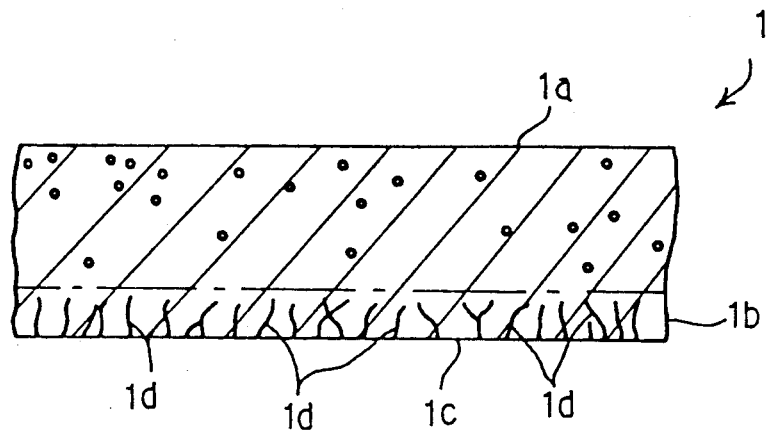
FIG. 1 is a cross sectional view showing a part of a silicon wafer unintentionally doped with mobile impurities.

FIG. 1 illustrates a single crystalline silicon wafer 1 unintentionally doped with mobile impurities such as, for example, heavy metal, and small bubbles are indicative of the unintentional mobile impurities. The unintentional mobile impurities mean substances except for dopant intentionally introduced and silicon forming the crystal. The silicon wafer 1 has a major surface 1a where an integrated circuit will be fabricated after a gettering stage according to the present invention. A damaged layer 1b is produced on the reverse side 1c of the silicon wafer 1, and crystal defects, which are represented by short real lines 1d, take place in the damaged portion 1b. The crystal defects 1d are dislocations, a stacking fault and grain boundaries, by way of example, and spread two-dimensionally or three dimensionally over the damaged portion 1b. However, a fairly amount of the crystal defects 1d reach and, accordingly, are exposed to the reverse side 1c. The damaged portion 1b is equal in thickness to or larger than 1 micron.

A gettering sequence starts with preparation of a single crystalline silicon wafer 1 of about 500 microns in thickness, and laser beam is radiated onto the reverse side 1c of the silicon wafer 1. The laser beam partially melts the single crystalline silicon, and brings dislocations into the crystal, thereby producing the damaged portion 1b. The damaged portion 1b thus produced has the crystal defects exposed to the reverse side 1c. In this instance, Nd YAG laser at 20 watt is radiated at scan mode of 100 mm/sec., and the damaged portion 1b is as thick as about 1 micron. Dislocation density measures about $10^{10}$ lines $cm^2$.

Various techniques are available for producing the damaged portion 1b. Such available techniques may be sand blasting and a deposition of polysilicon or silicon nitride. While silicon oxide particles are blown to the reverse side 1c in a sand blasting system, micro-cracks take place in the reverse surface portion of the silicon wafer 1, and are causative of dislocations growing in heat treatment. The silicon oxide particles may be 5 microns in average size, and the blowing may be continued at 5 kg/cm² for 10 seconds. Heat treatment at 750 degrees in centigrade may be desirable for growth of dislocations. The dislocations spreads over, and the damaged portion 1b is produced in the reverse surface portion.

The deposition of polysilicon or silicon nitride promotes grain boundaries. When polysilicon or silicon nitride is deposited on the reverse side through, for example, a chemical vapor deposition to a thickness of about 1.0 micron, grain boundaries spreads over the deposited film, and the deposited film serves as the damaged portion 1b.

Figure 2:
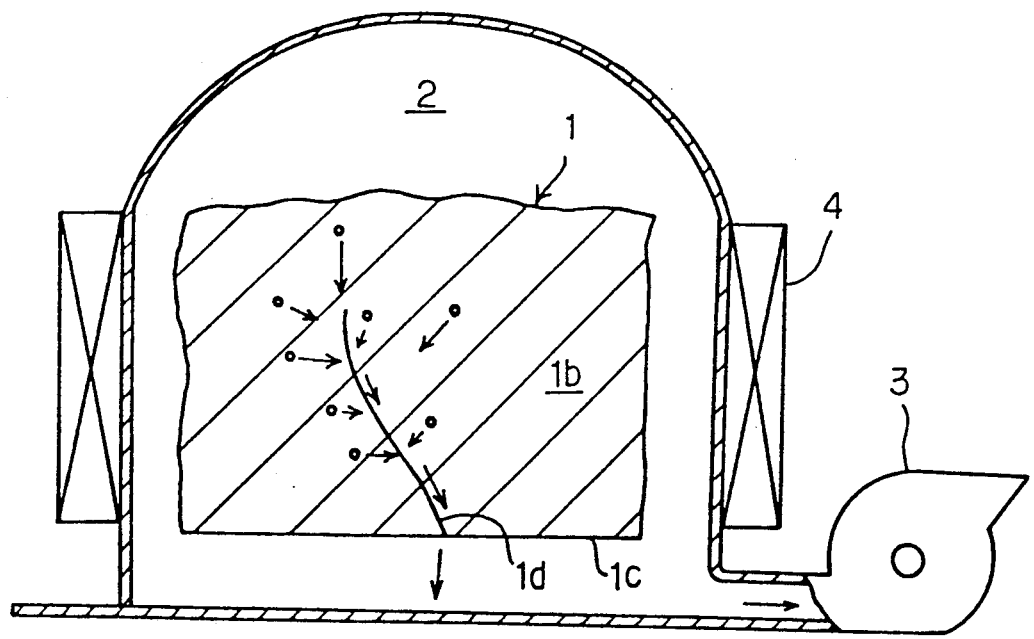
FIG. 2 is a view showing the function of a grain boundary produced in a damaged reverse surface of the silicon wafer.

Upon completion of the damaged portion 1b, the silicon wafer 1 is placed in a vacuum chamber 2 conducted to a vacuum pump 3 as shown in FIG. 2. The vacuum chamber 2 is accompanied with a heating unit 4. The vacuum pump 3 creates vacuum ambience of about $10^{-3}$ torr in the chamber 2, and the heating unit 4 elevates the temperature to about 700 degrees in centigrade. The vacuum pump 3 may increase the vacuum over $10^{-3}$ torr, and the temperature may exceed 700 degrees in centigrade. The silicon wafer 1 is kept in the high temperature vacuum ambience for about 60 minutes. However, the time period depends on the amount of the unintentional mobile impurities initially introduced in the silicon wafer 1, the density of the dislocations and acceptable density of the unintentional mobile impurities in the major surface portion.

In the high temperature vacuum ambience, unintentional mobile impurities are attracted to the crystal defects 1d, and the crystal defects 1d convey the unintentional mobile impurities to the reverse side 1d. The unintentional mobile impurities thus arrived at the reverse side 1c are evacuated to the vacuum chamber 2, and are, in turn, evacuated from the vacuum chamber 2 to the outside thereof. Thus, the unintentional mobile impurities segregated in the damaged portion 1b are continuously evacuated therefrom, and, for this reason, the damaged portion 1b is never saturated with the unintentional mobile impurities. This results in that the unintentional mobile impurities are sufficiently evacuated from the single crystalline silicon wafer 1 through the heat treatment in vacuum without deceleration, and the major surface 1a is free from the unintentional mobile impurities before delivery. Since the damaged portion 1b free from the saturation promotes the segregation of the unintentional mobile impurities, the gettering technique according to the present invention achieves an improved throughput.

The inventors confirmed the advantage of the present invention as follows. First, the reverse side 1c of a silicon wafer was exposed to solution of 0.1 mol % copper nitrate for 30 seconds, and was, thereafter, rinsed in pure water. The silicon wafer was placed in nitrogen ambience at 950 degrees in centigrade for 30 minutes. Within a minute, the silicon wafer was taken out from the high temperature nitrogen ambience, and a piece of silicon was cut from the silicon wafer. The piece of silicon was observed in room temperature through a transmission electron microscope system. The copper was trapped by the dislocations, and the inventors confirmed the function of the dislocations.

Subsequently, the piece of silicon was heated in vacuum under observation through the transmission electron microscope system. When the temperature reached 700 degrees in centigrade, the copper started decreasing, and the copper was perfectly extinguished around 900 degrees in centigrade. The inventors confirmed the evacuation of copper in the high temperature vacuum ambience.

Figure 3:
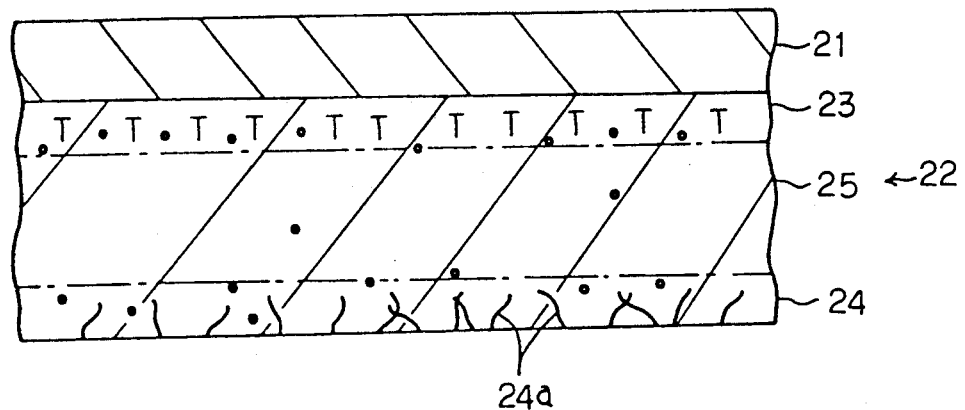
FIG. 3 is a cross sectional view showing a part of an epitaxial silicon wafer unintentionally doped with mobile impurities.

Turning to FIG. 3 of the drawings, another silicon wafer comprises an epitaxial layer 21 of silicon grown on a single crystal silicon layer 22, and a gettering layer 23 is produced at the boundary therebetween. A large amount of dislocations are produced along the gettering layer 23, and the dislocations are indicated by "T" in FIG. 3. Concentration of intentional dopant is controlled so that large distortion takes place along the boundary, and is causative of the large amount of dislocations. Circuit component elements are formed in and on the epitaxial layer 21, and, accordingly, the epitaxial layer 21 serves as an active layer. A damaged surface portion 24 is produced on the reverse side by using one of the various techniques described hereinbefore. There are a lot of crystal defects 24a indicated by short real lines in the damaged surface portion 24, and a large number of the crystal defects 24a are exposed on the reverse surface. Between the gettering layer 23 and the damaged surface portion 24 is formed a transferring layer 25 which provides transferring paths from the gettering layer 23 to the damaged surface portion 24 for unintentionally doped mobile impurities represented by small bubbles.

Figure 4:
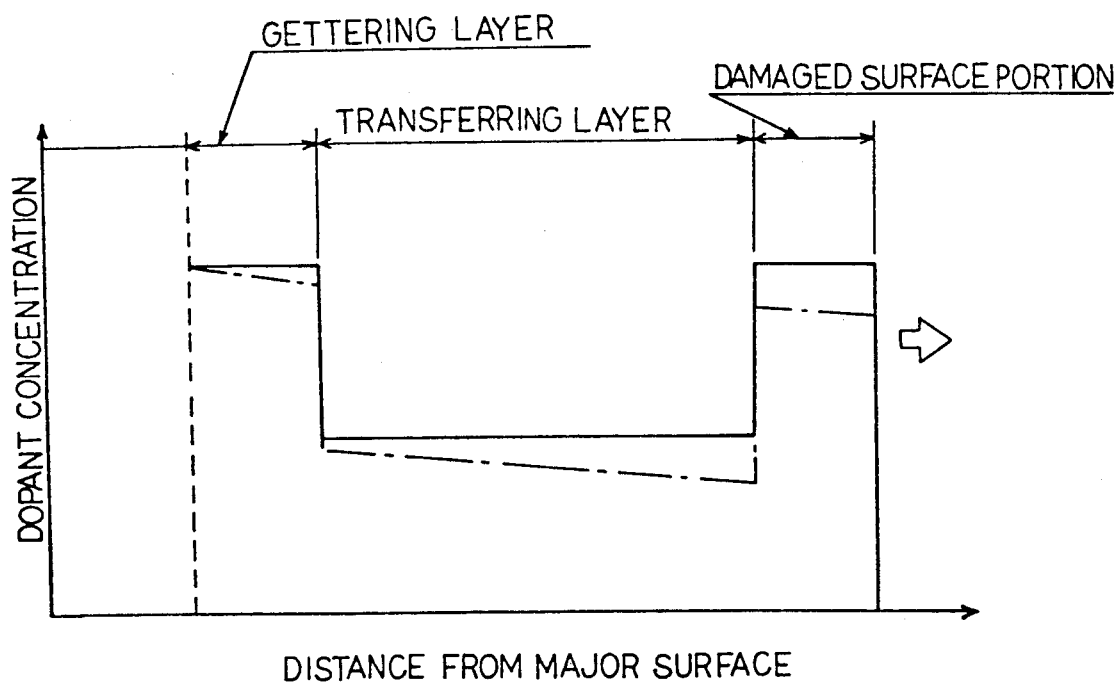
FIG. 4 is a graph showing dopant concentration in terms of distance from the major surface of the epitaxial silicon wafer.

The transferring layer 25 is produced as follows. First, the epitaxial layer 23, the transferring layer 25 and the damaged surface portion 24 are intentionally doped with impurities as indicated by real line in FIG. 4, and the intentional dopant is vaporized from the reverse surface under heat application. Then, the dopant concentration is graded as indicated by dot-and-dash line, because the dopant impurities are segregated from the boundary between the epitaxial layer 21 and the single crystal silicon layer 22 toward the reverse surface. The unintentional mobile impurities are conveyed through the graded transferring layer 25, and reach the damaged surface portion 24.

The epitaxial silicon wafer shown in FIG. 3 is subjected to the gettering according to the present invention, and the sequence of the gettering is similar to the sequence described in connection with FIGS. 1 and 2. Since the gettering layer 23 is provided beneath the active layer or the epitaxial layer 21, the unintentionally doped mobile impurities are effectively caught by the gettering layer 23, and are conveyed through the transferring layer 25 to the damaged surface portion 24. The unintentionally doped mobile impurities are, thereafter, evacuated from the reverse surface as similar to those of the silicon wafer shown in FIGS. 1 and 2.

Although particular embodiments of the present invention have been shown and described, it will be obvious to those skilled in the art that various changes and modifications may be made without departing from the spirit and scope of the present invention.

What is claimed is:

1. A method of gettering unintentional mobile impurities, comprising the steps of:
   a) preparing a silicon wafer unintentionally doped with said mobile impurities and having a major surface;
   b) producing a damaged surface portion on a reverse side of said silicon wafer, said damaged surface portion having crystal defects exposed to said reverse side; and c) placing said silicon wafer in a high temperature vacuum ambience so as to evacuate said mobile impurities from said reverse side to said high temperature vacuum ambience without removing said damaged surface portion from the wafer.

2. A method as set forth in claim 1, in which said damaged surface portion is produced through any one of a laser-beam radiation, a sand blasting and a deposition of polysilicon or silicon nitride.

3. A method as set forth in claim 2, in which said damaged surface portion is equal to or larger in thickness than about 1 micron.

4. A method as set forth in claim 1, in which said high temperature vacuum ambience is equal to or higher than 700 degrees in centigrade.

5. A method as set forth in claim 4, in which said high temperature vacuum ambience is equal to or larger than $10^{-3}$ torr.

6. A method as set forth in claim 5, in which said damaged surface portion is spaced apart from a gettering layer beneath said major surface by a transferring layer.

7. A method of gettering unintentional mobile impurities, comprising the steps of:
a) preparing a silicon wafer unintentionally doped with said mobile impurities and having a major surface, said silicon wafer being about 500 microns in thickness;
b) producing a damaged surface portion on a reverse side of said silicon wafer through a laser beam radiation, said damaged surface portion having crystal defects exposed to said reverse side, said damaged surface portion being about 1 micron in thickness; and
c) placing said silicon wafer in a high temperature vacuum ambience so as to evacuate said mobile impurities from said reverse side to said high temperature vacuum ambience without removing said damaged surface portion from the wafer, said high temperature vacuum ambience being not smaller in temperature than 700 degrees in centigrade and not smaller in vacuum than $10^{-3}$ torr.

* * * * *